(12) United States Patent
Cheng et al.

(10) Patent No.: US 7,138,308 B2
(45) Date of Patent: Nov. 21, 2006

(54) REPLACEMENT GATE WITH TERA CAP

(75) Inventors: Kangguo Cheng, Beacon, NY (US); Ramachandra Divakaruni, Ossining, NY (US); Kenneth T. Settlemyer, Jr., Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 78 days.

(21) Appl. No.: 10/905,070

(22) Filed: Dec. 14, 2004

(65) Prior Publication Data

US 2006/0128055 A1    Jun. 15, 2006

(51) Int. Cl.
   *H01L 21/336*   (2006.01)
   *H01L 21/8234*  (2006.01)
   *H01L 21/3205*  (2006.01)
   *H01L 21/4763*  (2006.01)
   *H01L 21/302*   (2006.01)

(52) U.S. Cl. ............ 438/197; 438/585; 438/706; 438/586

(58) Field of Classification Search ............. 438/83, 438/706, 197, 585, 586, 595
   See application file for complete search history.

(56) References Cited

U.S. PATENT DOCUMENTS

| | | | |
|---|---|---|---|
| 6,147,009 A | 11/2000 | Grill et al. | |
| 6,180,978 B1 | 1/2001 | Chatterjee et al. | |
| 6,271,132 B1 | 8/2001 | Xiang et al. | |
| 6,316,167 B1 | 11/2001 | Angelopoulos et al. | |
| 6,372,559 B1 | 4/2002 | Crowder et al. | |
| 6,403,434 B1 | 6/2002 | Yu | |
| 6,440,868 B1 | 8/2002 | Besser et al. | |
| 6,492,249 B1 | 12/2002 | Xiang et al. | |
| 6,495,437 B1 | 12/2002 | Yu | |
| 6,514,667 B1 | 2/2003 | Angelopoulos et al. | |
| 6,528,362 B1 | 3/2003 | Besser et al. | |
| 6,580,137 B1 | 6/2003 | Parke | |
| 6,607,950 B1 * | 8/2003 | Henson et al. | 438/197 |
| 6,620,664 B1 | 9/2003 | Ma et al. | |
| 7,022,622 B1 * | 4/2006 | Cheng et al. | 438/781 |

OTHER PUBLICATIONS

U.S. Appl. No. 10/710,409, "Method and Structure to Improve Properties of Tunable Anti-Reflective Coatings", filed Jul. 8, 2004.

* cited by examiner

*Primary Examiner*—Chuong Anh Luu
(74) *Attorney, Agent, or Firm*—Eric W. Petraske; Yuanmin Cai

(57) ABSTRACT

A field effect transistor formed by a sacrificial gate process has a simplified process and improved yield by using a tunable resistant anti-reflective coating (TERA) as the cap layer over the sacrificial gate layer. The TERA layer serves as a tunable anti-reflection layer for photolithography patterning, a hardmask for etching the sacrificial gate, a polish stopping layer for planarization, and a blocking layer for preventing silicide formation over the sacrificial gate. The TERA is stripped by a two-step process that is highly selective to the nitride spacers, so that the spacers are not damaged in the process of stripping the sacrificial gate.

20 Claims, 6 Drawing Sheets

REPLACEMENT GATE WITH TERA CAP

TECHNICAL FIELD

The field of the invention is that of integrated circuit fabrication, in particular forming a replacement gate Field Effect Transistor (FET).

BACKGROUND OF THE INVENTION

Current integrated circuit fabrication sometimes uses a process that defines and constructs a FET using a replacement gate (sometimes referred to as a dummy gate or sacrificial gate), in which the gate stack is defined with a temporary gate, that remains in place while the halo and extension implants are made, the S/D are implanted and the first level interlevel dielectric (ILD) is formed, after which the temporary gate is removed and a replacement gate and gate dielectric having superior electrical properties, but inferior durability replace the temporary gate in a manner that fits the replacement components into the space left by the sacrificial gate.

This method conventionally uses nitride spacers and also a nitride cap layer over the sacrificial gate. When the cap layer is stripped, in order to remove the sacrificial gate and gate dielectric, the nitride spacer is damaged. This damaged spacer complicates the process and can cause the degradation or even failure of the device. U.S. Pat. No. 6,607,950 discloses a SiC cap layer over the sacrificial gate to prevent the damage of the nitride spacer. The disadvantage of using a SiC cap is that the properties of SiC are not tunable to accommodate the various requirements of the lithography process. Furthermore, it is difficult to use SiC as a hardmask to etch the sacrificial gate due to the low selectivity between SiC and polysilicon.

The art could benefit from a replacement gate process that provides the benefits of superior electrical performance from the replacement gate and avoids the damage caused in the process of replacing the sacrificial gate. It is also desired to have a simplified and cost-effective replacement gate process with a cap layer that serves multiple functions including a tunable anti-reflection layer for photolithography patterning, a hardmask to etch the sacrificial gate, a polish stopping layer for planarization, and a protection layer prevent silicide formation over the sacrificial gate. It is further desired that the cap layer can be removed highly selectively to other materials.

SUMMARY OF THE INVENTION

The invention relates to a method of forming a planar FET transistor by a replacement gate process that uses a tunable etch resistance ARC (TERA) as the cap layer on the sacrificial gate.

A feature of the invention is that the TERA layer performs as the ARC layer in patterning the gate stack.

Another feature of the invention is that the TERA layer performs as a hardmask in patterning the sacrificial gate.

Yet another feature of the invention is that the TERA layer is converted into a material containing silicon, oxygen, and carbon, and a small amount of hydrogen in forming the source and drain.

Yet another feature of the invention is that the converted TERA layer prevents silicide formation on the top surface of the sacrificial gate, thereby facilitating the removal of the sacrificial gate.

Yet another feature of the invention is that the converted TERA layer serves as a stop layer in polishing the interlevel dielectric.

Yet another feature of the invention is that the converted TERA layer is etched highly selective to other materials.

Yet another feature of the invention is that the one layer performs as the ARC layer, hardmask layer, protection layer, polishing stopping layer.

DETAILED DESCRIPTION

Figure 1A:
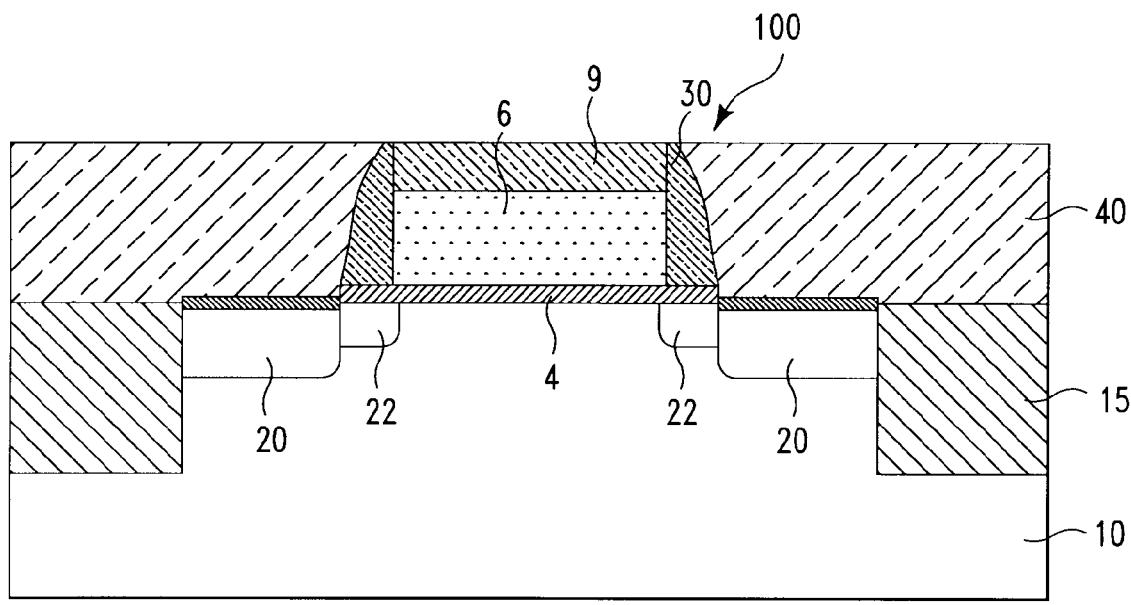
FIGS. 1A and 1B show steps in the prior art process.
Figure 1B:
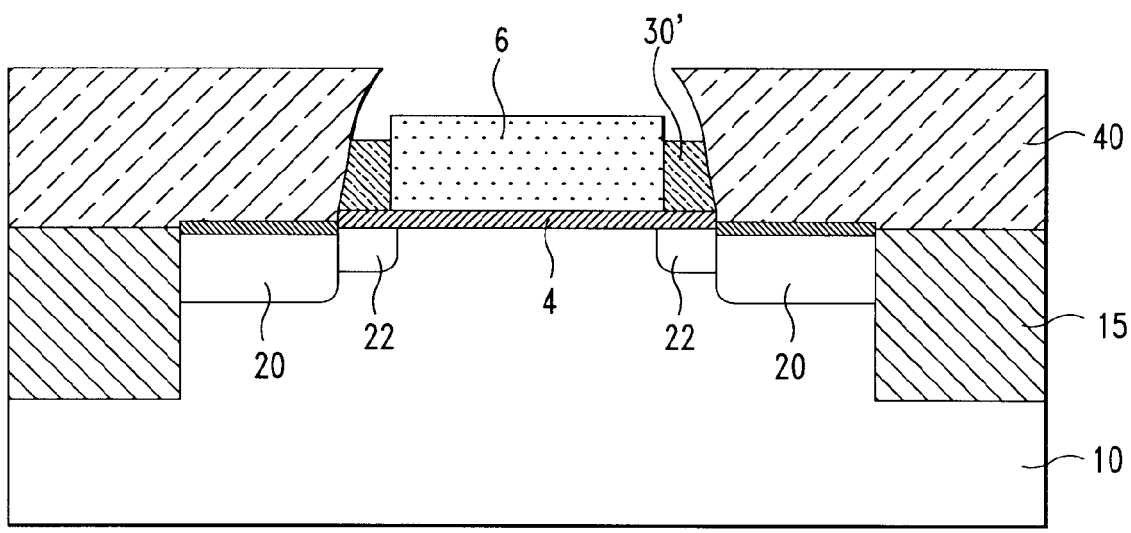

The problem addressed by the present invention is illustrated in FIGS. 1A and 1B, showing a step in the prior art process before stripping the nitride cap over the sacrificial gate.

In FIG. 1A, a transistor 100 is being formed in substrate 10, isolated by conventional shallow trench isolation 15. A poly sacrificial gate 6 has been formed over gate dielectric 4, bounded by nitride spacers 30 and by nitride cap layer 9. Conventional halo and extension implants 22 and source/drain 20 have been formed.

A nitride cap layer has been selected for its value as a CMP stop and for its etch resistance for forming the interlevel dielectric 40, e.g., BPSG.

FIG. 1B shows the same transistor after the conventional step of stripping the cap layer 9 in order to remove the sacrificial gate and the gate dielectric 4. As can be seen, the stripping process of the cap layer has also attacked the nitride spacers 30, removing an upper portion of the spacers, leaving a reduced spacer 30'.

The prior art has used various methods of compensating for this undesired spacer removal, but they all have various drawbacks that add process complexity and cost.

Figure 2:
FIGS. 2 through 11 show steps in the present process.

FIG. 2 shows an initial stage in forming a transistor according to the present invention, in which semiconductor substrate 10 has isolation members 15 formed in it to isolate the transistor that will be formed in this area. Preferably, the isolation members 15 are formed by the conventional process of shallow trench isolation (STI).

Figure 3:
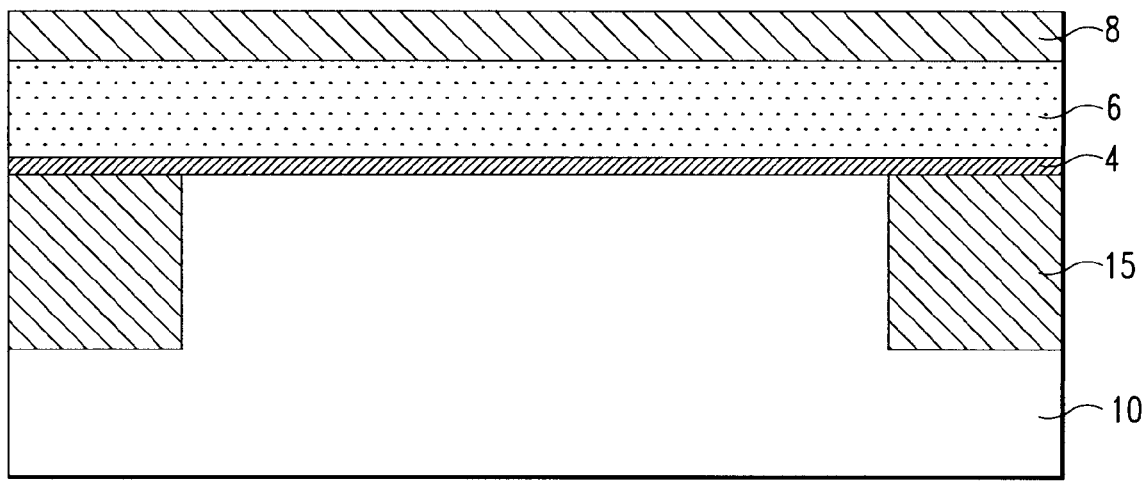

FIG. 3 shows the result of forming a temporary gate oxidation layer 4, e.g. thermal oxide, and depositing a sacrificial gate 6, illustratively polysilicon (poly). A layer of TERA 8 has been deposited above layer 6.

The TERA layer may be as illustrated in U.S. Pat. No. 6,316,167, the disclosure of which is incorporated by reference. These materials include material having the composition R:C:H:X, where R is selected from Si, Ge, B, Sn, Fe, Ti and mixtures of these elements. X is optional and may include O, N, S, F and mixtures of these elements. C is carbon and H is hydrogen.

The preferred atomic % ranges for R are the following: preferably 0% to 95%, more preferably 0.5% to 95%, most preferably 1 to 60% and most highly preferably 5 to 50%. The preferred atomic % ranges for C are the following: preferably 0% to 95%, more preferably 0.5% to 95%, most preferably 1 to 60% and most highly preferably 5 to 50%. The preferred atomic % ranges for H are the following: preferably 0% to 50%, more preferably 0.5% to 50%, most preferably 1 to 40% and most highly preferably 5 to 30%. The preferred atomic % ranges for X are the following: preferably 0% to 70%, more preferably 0.5% to 70%, most preferably 1 to 40% and most highly preferably 5 to 30%.

Figure 4:
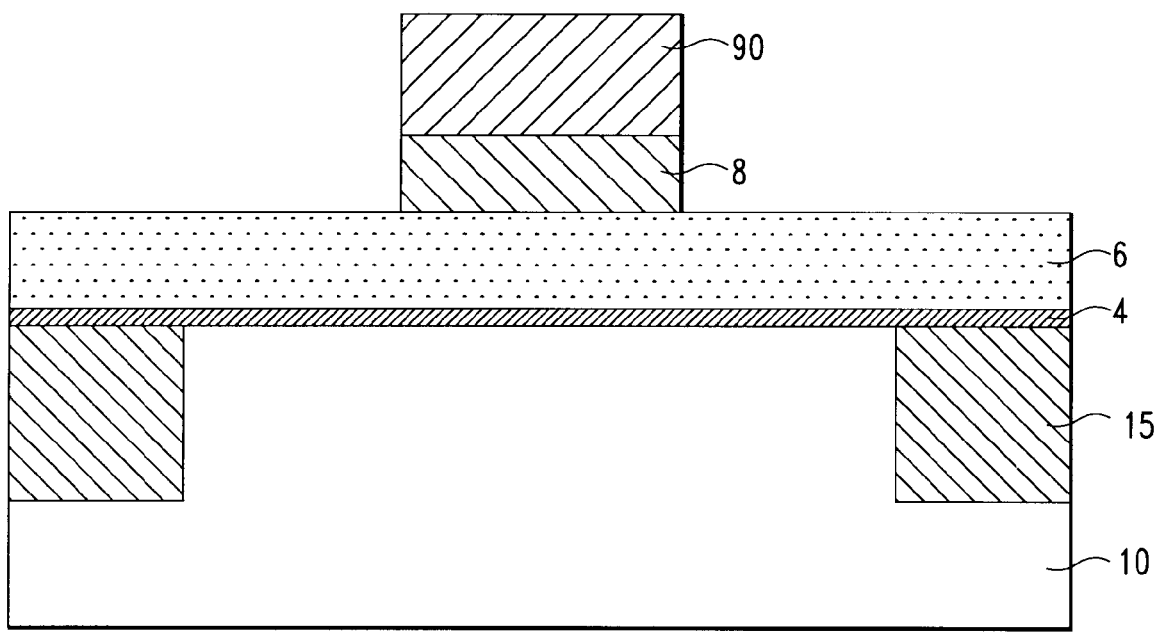

FIG. 4 shows the result of depositing, developing and patterning a layer of photo resist 90, then etching the TERA layer, stopping a or poly layer 6.

Figure 5:
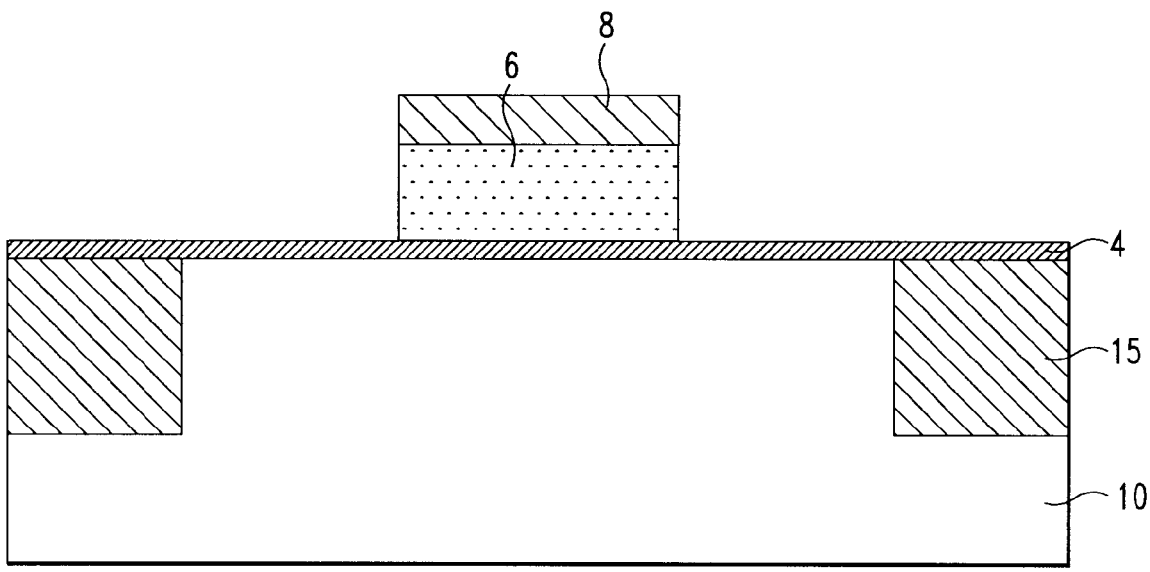

FIG. 5 shows the result that the remaining resist 90 is stripped and the TERA is used as a hardmask to etch the gate poly layer to define the sacrificial gate. Using TERA as the cap over the sacrificial gate has several advantages. First, TERA acts as the ARC layer in patterning the sacrificial gate, so no additional ARC is needed. Second, a high etch selectivity up to 1:20 between TERA and poly can be achieved when TERA is used as a hardmask to pattern the sacrificial gate. Third, using a TERA hardmask enables a precise control of dimensions and profile of the sacrificial gate. Other advantages of TERA cap will become clear in the subsequent processes.

Figure 6:
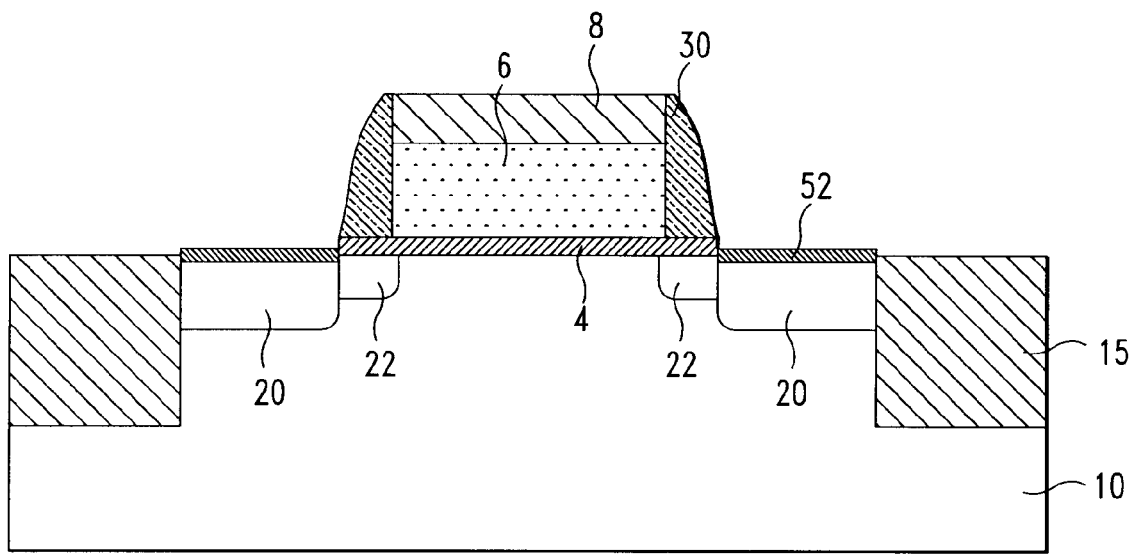

FIG. 6 shows the result of a number of following steps of implanting the conventional halo and extension implants 22, forming nitride spacers 30 by deposition and directional reactive ion etching (RIE). A source/drain implant step and a silicide step form S/D 20 and silicide layers 52 over the S/D.

A thermal anneal process is performed after each or entire implantation process to activate the dopants. The thermal anneal can be performed by a furnace process or a rapid thermal process (RTP). During the anneal process, some of the hydrogen species is driven out from the TERA layer, converting it to film with less hydrogen. For example, the hydrogen amount in the as-deposited TERA film is about 25% (atomic percentage). After source/drain anneal, the hydrogen amount in the TERA film drops to less than 10% (atomic percentage).

The converted TERA is very inert, so that the etch process that defines spacers 30 from an initial conformal nitride layer does not remove any significant quantity of the TERA cap over the sacrificial gate.

Figure 7:
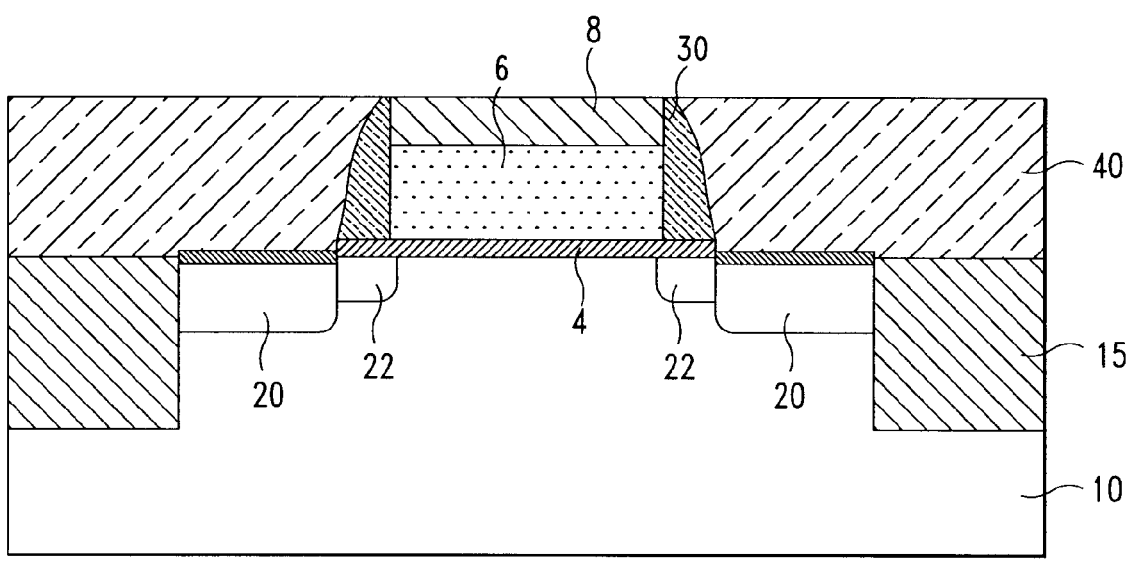

FIG. 7 shows the result of depositing an interlevel dielectric 40, e.g., BPSG, then planarizing the structure, stopping on the TERA layer 8 which contains less hydrogen than it was deposited. The converted TERA is also very polish-resistant, so the topography of the structure can be planarized by polishing the interlevel dielectric with the converted TERA as the stopping layer.

It is an advantageous feature of the invention that the hydrogen amount in the TERA layer is different before and after thermal anneal. The high concentration of hydrogen in the as-deposited TERA film renders it a superior ARC and hardmask for patterning the sacrificial gate. The low concentration of hydrogen in the TERA film after anneal renders it a superior etch and polish stopping layer. The transition of the TERA film characteristics is achieved along with the device manufacturing process and no extra process is needed for this transition.

Figure 8:
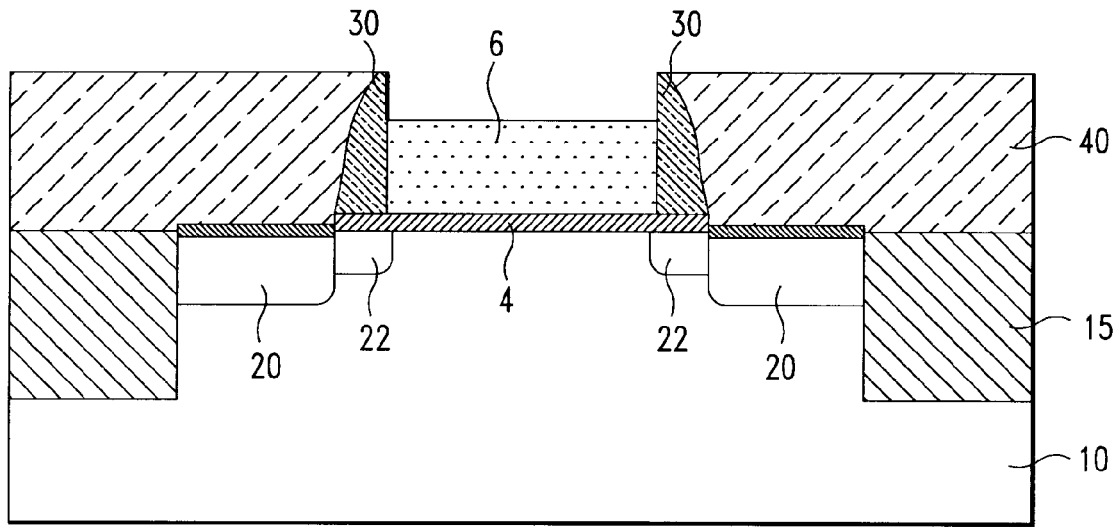

FIG. 8 shows the result of removing the TERA cap on the gate poly. It has been found that, in addition to the other beneficial properties of TERA, that it can be stripped with great selectively to oxide, poly and nitride. Selective of greater than 100:1 is readily achieved.

This figure illustrates the avoidance of damage to the nitride spacers 30 and therefore the avoidance of yield detractors as a result of such damage.

Although TERA is highly chemically inert, it has been found that TERA can be stripped very selectively to other material such as thermal oxide, nitride and poly by a two step process.

The first step is one in which the TERA is converted/hydrated with a plasma process. The second step is an etching step using HF in a non-aqueous base. In the hydration process, water or hydroxyl (OH—) groups are incorporated into TERA by exposing TERA in a plasma containing O2, H2 and/or water. The hydrated TERA film is then etched by hydrogen fluoride. Ethylene glycol is usually added to the HF with a ratio of 125:1 to 250:1. Note that the HF used to etch TERA is not hydrofluoric acid, which is an aqueous solution of hydrogen fluoride and water in which the hydrogen and fluorine atoms are dissociated. The TERA etch selectivity by this method can be easily greater than 100:1.

Figure 9:
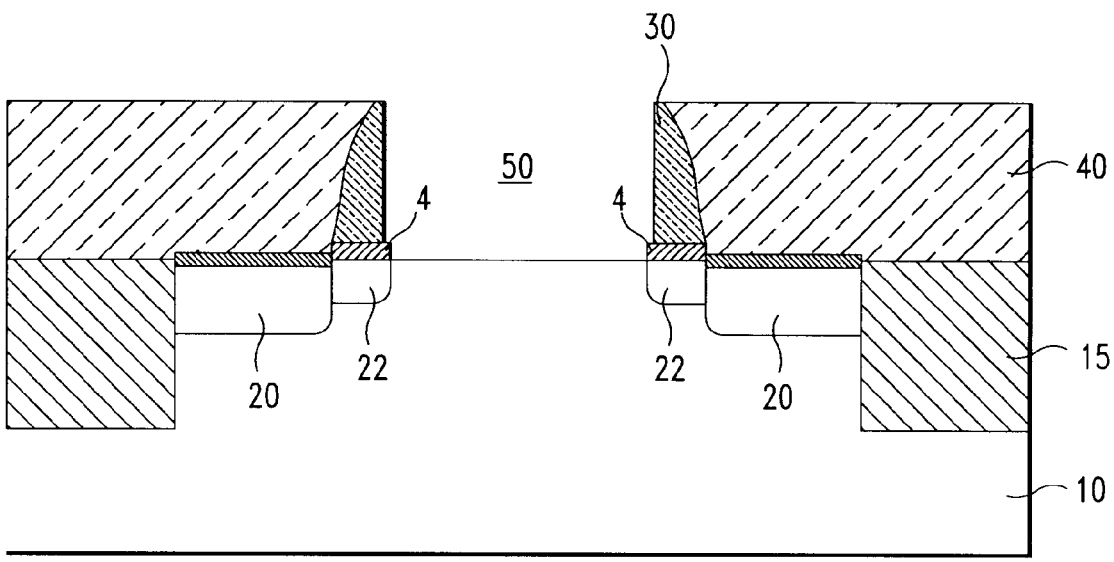

FIG. 9 illustrates the result of removing the sacrificial gate 6 and the gate dielectric 4, leaving an aperture 50 to be filled with an electrically superior gate and gate dielectric.

Figure 10:
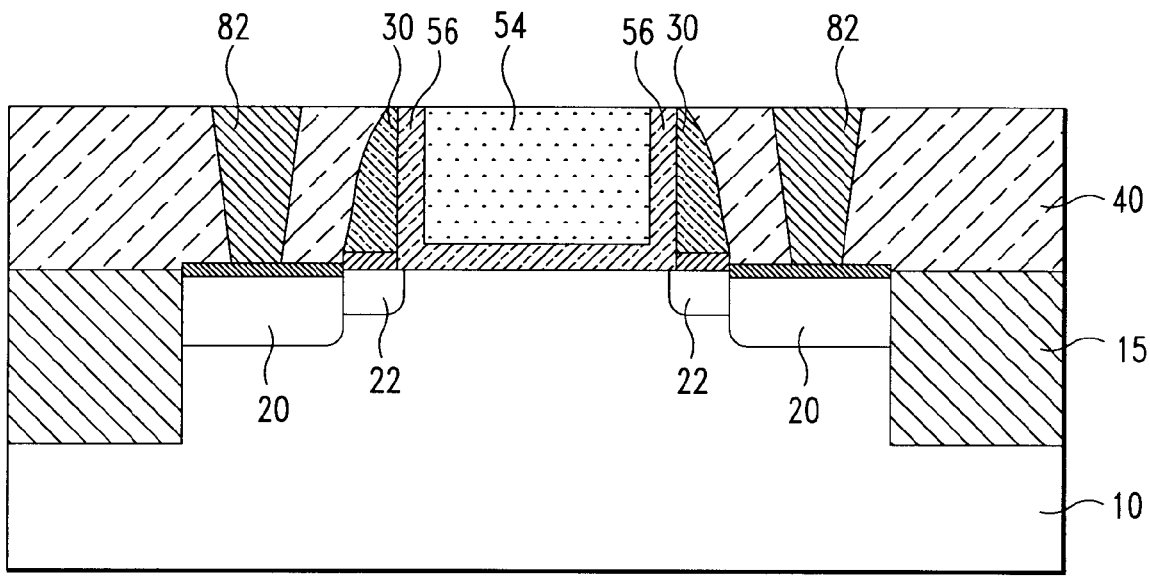

FIG. 10 illustrates the result of depositing a conformal layer of high-k gate dielectric 52 such as Si3N4, HfO2, Ta2O5, HfSiO4, or other dielectric materials. The remainder of aperture 50 can then be filed with a gate conductor such as polysilicon, a metal, and/or metallic compound 54. For example, tungsten (W) or TiN can be used as gate conductor. A conventional planarization step prepares the structure for the next step.

Figure 11:
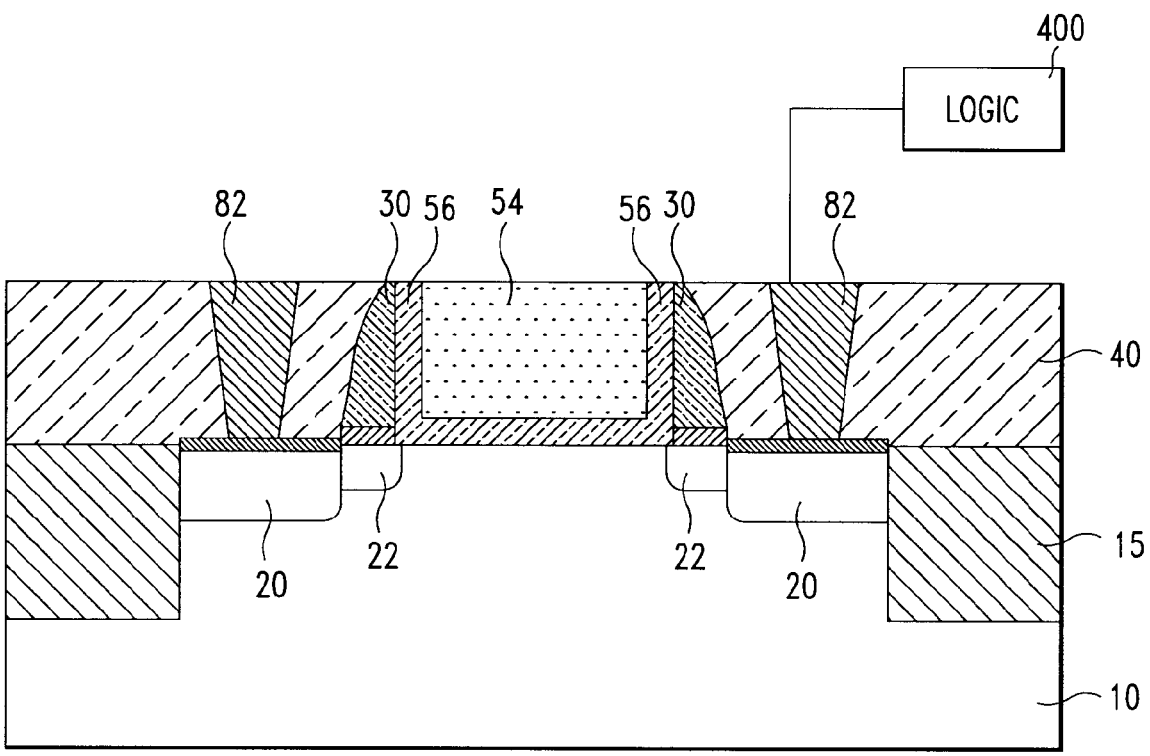

FIG. 11 shows the result of forming conductive vias and filling them to make contacts 82 to the source and drain. Contacts 82 and the exposed top surface of gate conductor 54 are now available for the next level of interconnect.

Box 400, connected to drain contact 82 represents schematically the remainder of the integrated circuit that this transistor is part of.

The process may be summarized as:
Prepare a semiconductor substrate including preliminary implants;
Prepare sacrificial gate layers including a gate dielectric, a sacrificial gate and a TERA gate cap layer;
Pattern gate stack;
Form source-drain and remove part of hydrogen in TERA layer.
Form nitride spacers;
Form interlevel dielectric;
Strip TERA selectively to nitride;
Remove sacrificial gate and gate dielectric;
Form high-k gate dielectric and gate conductor;
Form contacts;
Complete back end process.

Those skilled in the art will be aware that NFETs and PFETS may be formed according to the invention and that the semiconductor device may be formed in a bulk or SOI wafer using silicon, germanium, SiGe or other semiconductors.

While the invention has been described in terms of a single preferred embodiment, those skilled in the art will recognize that the invention can be practiced in various versions within the spirit and scope of the following claims.

What is claimed is:

1. A method of forming a field effect transistor in a semiconductor substrate comprising the steps of:
    forming a temporary gate dielectric layer, a temporary gate layer and a temporary TERA gate cap;
    patterning a temporary gate stack containing a temporary gate;
    forming insulating spacers adjacent to said temporary gate stack;
    forming a source and drain adjacent to said temporary gate;
    stripping said TERA gate cap selectively to said spacers;
    removing said temporary gate and said temporary gate dielectric layer below said temporary gate, stopping on said semiconductor substrate;

depositing a high-k conformal gate dielectric layer; and
depositing a gate conductor.

2. A method according to claim 1, in which said TERA gate cap acts as a hardmask as well as an antireflective coating during said step of patterning said temporary gate stack.

3. A method according to claim 1, further comprising steps of depositing and planarizing an interlevel dielectric and polishing.

4. A method according to claim 3, in which said TERA cap acts as a polish stopping layer during said step of planarizing said interlevel dielectric.

5. A method according to claim 4, in which said TERA gate cap initially contains hydrogen and at least part of the hydrogen species is removed from the said TERA in an anneal step performed before said step of polishing said interlevel dielectric in forming source and drain.

6. A method according to claim 1, in which said TERA gate cap initially contains hydrogen and said TERA layer contains less hydrogen after forming said source and drain.

7. A method according to claim 5, in which the TERA layer contains less hydrogen after forming source and drain.

8. A method according to claim 5, in which the hydrogen atomic percentage is less than 10% after forming said source and drain.

9. A method according to claim 1, in which said step of stripping said TERA gate cap comprises a step of exposing and converting said TERA gate cap in a plasma containing O or H followed by a step of etching said gate cap.

10. A method according to claim 9, in which said spacers are composed of nitride.

11. A method according to claim 1, in which the antireflective coating layer, hardmask layer, the layer protecting the sacrificial gate in forming the spacer, and the layer preventing silicide formation on the sacrificial gate, is the same material.

12. A method according to claim 3, in which the antireflective coating layer, hardmask, the layer protecting the sacrificial gate in forming the spacer, the layer preventing silicide formation on the sacrificial gate, and polishing stopping layer, is the same material.

13. A method according to claim 11, in which said layer material is TERA.

14. A method according to claim 12, in which said layer material is TERA.

15. A method of forming an integrated circuit containing at least one field effect transistor formed in a semiconductor substrate comprising the steps of:
    forming a temporary gate dielectric layer, a temporary gate layer and a temporary TERA gate cap;
    patterning a temporary gate stack containing a temporary gate;
    forming insulating spacers adjacent to said temporary gate stack;
    forming a source and drain adjacent to said temporary gate;
    stripping said TERA gate cap selectively to said spacers;
    removing said temporary gate and said temporary gate dielectric layer below said temporary gate, stopping on said semiconductor substrate;
    depositing a high-k conformal gate dielectric layer; and
    depositing a gate conductor.

16. A method according to claim 15, further comprising steps of depositing a planarizing an interlevel dielectric.

17. A method according to claim 15, in which said TERA cap acts as a hardmask, an antireflective coating, polish stopping layer, the layer protecting the sacrificial gate in forming the spacer, and the layer preventing silicide formation on the sacrificial gate.

18. A method according to claim 15, in which said TERA gate cap initially contains hydrogen and at least part of the hydrogen species is removed from the said TERA in an anneal step performed before said step of polishing said interlevel dielectric in forming source and drain.

19. A method according to claim 15, in which the TERA layer contains less hydrogen after forming said source and drain.

20. A method according to claim 15, in which said step of stripping said TERA gate cap comprises a step of exposing and converting said TERA gate cap in a plasma containing O or H followed by a step of etching said gate cap.

* * * * *